(12) United States Patent
Schulze et al.

(10) Patent No.: US 11,264,464 B2
(45) Date of Patent: Mar. 1, 2022

(54) SILICON CARBIDE DEVICES AND METHODS FOR FORMING SILICON CARBIDE DEVICES

(71) Applicant: Infineon Technologies AG, Neubiberg (DE)

(72) Inventors: Hans-Joachim Schulze, Taufkirchen (DE); Thomas Basler, Ottenhofen (DE); Andre Rainer Stegner, Unterhaching (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/576,042

(22) Filed: Sep. 19, 2019

(65) Prior Publication Data

US 2020/0098869 A1 Mar. 26, 2020

(30) Foreign Application Priority Data

Sep. 20, 2018 (DE) .......................... 102018123210.1

(51) Int. Cl.
*H01L 29/167* (2006.01)
*H01L 29/16* (2006.01)
*H01L 29/739* (2006.01)

(52) U.S. Cl.
CPC ........ *H01L 29/167* (2013.01); *H01L 29/1608* (2013.01); *H01L 29/7397* (2013.01)

(58) Field of Classification Search
CPC .......................... H01L 29/167; H01L 29/1608
See application file for complete search history.

(56) References Cited

U.S. PATENT DOCUMENTS

| | | | |
|---|---|---|---|
| 9,773,883 B2* | 9/2017 | Soeno | H01L 29/4236 |
| 2016/0247884 A1* | 8/2016 | Ohashi | H01L 29/4916 |
| 2018/0097079 A1* | 4/2018 | Utsumi | H01L 29/4236 |

* cited by examiner

*Primary Examiner* — Matthew L Reames
(74) *Attorney, Agent, or Firm* — Cooper Legal Group LLC

(57) ABSTRACT

A silicon carbide device includes a transistor cell with a front side doping region, a body region, and a drift region. The body region includes a first portion having a first average net doping concentration and a second portion having a second average net doping concentration. The first portion and the second portion have an extension of at least 50 nm in a vertical direction. The first average net doping concentration is at least two times the second average net doping concentration, and the first average net doping concentration is at least $1 \cdot 10^{17}$ cm$^{-3}$.

23 Claims, 3 Drawing Sheets

SILICON CARBIDE DEVICES AND METHODS FOR FORMING SILICON CARBIDE DEVICES

RELATED APPLICATION

This application claims priority to German Patent Application No. 102018123210.1, filed on Sep. 20, 2018, entitled "Silicon carbide devices and methods for forming silicon carbide devices", which is incorporated herein.

FIELD

Examples of the disclosure relate to silicon carbide devices. Further examples relate to methods for forming silicon carbide devices.

BACKGROUND

Short-channel effects like drain induced barrier lowering may occur due to the ongoing shrinking of transistors. For example, a space-charge region may penetrate from a drain region into a body region and influence a threshold voltage of the transistor.

A threshold voltage of the transistor may be reduced or a switch-off characteristic may be impaired by drain induced barrier lowering, for example. It may be desired to improve semiconductor devices or to reduce short-channel effects in semiconductor devices.

SUMMARY

An example relates to a silicon carbide device. The silicon carbide device comprises a transistor cell. The transistor cell comprises a front side doping region having a first conductivity type. The transistor cell comprises a body region having a second conductivity type. The transistor cell comprises a drift region having the first conductivity type. The body region is located between the front side doping region and the drift region in a vertical direction. The body region comprises a first portion having a first average net doping concentration. The body region comprises a second portion having a second average net doping concentration. The first portion is located between the drift region and the second portion. The first portion has an extension of at least 50 nm in the vertical direction. The second portion has an extension of at least 50 nm in the vertical direction. The first average net doping concentration is at least two times the second average net doping concentration. The first average net doping concentration is at least $1 \cdot 10^{17}$ cm$^{-3}$.

A further example relates to a silicon carbide device. The silicon carbide device comprises a transistor cell. The transistor cell comprises a front side doping region having a first conductivity type. The transistor cell comprises a body region having a second conductivity type. The transistor cell comprises a drift region having the first conductivity type. The body region is located between the front side doping region and the drift region in a vertical direction. The body region comprises a first portion having a first average net doping concentration. The body region comprises a second portion having a second average net doping concentration. The body region comprises a third portion having a third average net doping concentration. The first portion is located between the drift region and the second portion. The second portion is located between the first portion and the third portion. The first portion has an extension of at least 50 nm in the vertical direction. The second portion has an extension of at least 50 nm in the vertical direction. The third portion has an extension of at least 50 nm in the vertical direction. The first average net doping concentration is at least two times the second average net doping concentration. The third average net doping concentration is at least two times the second average net doping concentration.

According to an embodiment, a method for forming a silicon carbide device comprises implanting first dopants into a silicon carbide substrate with a first implantation dose to form a first portion of a body region of a transistor of the silicon carbide device. The first portion of the body region has an extension of at least 50 nm within the body region in a vertical direction. The method further comprises implanting second dopants into the silicon carbide substrate with a second implantation dose to form a second portion of the body region. The first implantation dose is at least two times the second implantation dose and at least $2 \cdot 10^{12}$ cm$^{-2}$.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
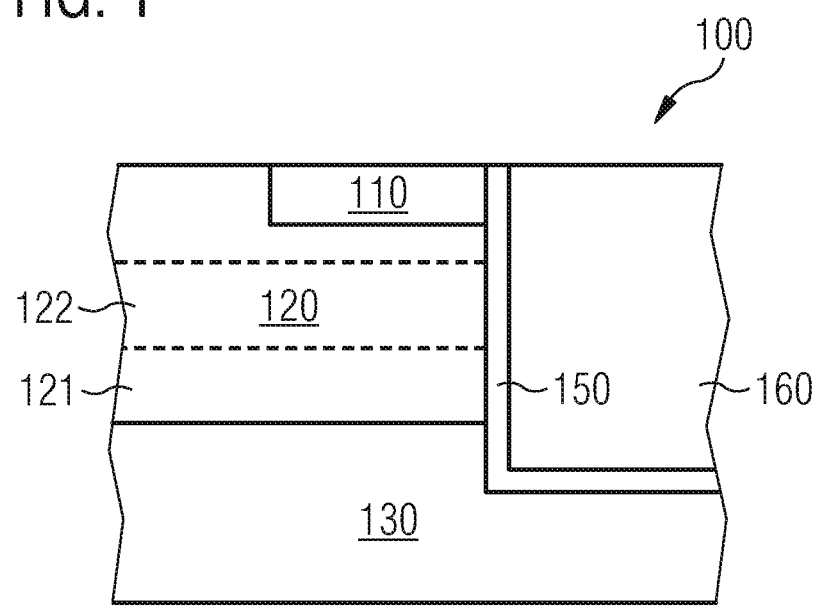
FIG. 1 shows a schematic cross section of an embodiment of a silicon carbide device with a body region comprising at least two portions.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some examples thereof are shown in the figures and will subsequently be described in detail. However, this detailed description does not limit further examples to the particular forms described. Further examples may cover all modifications, equivalents, and alterna-tives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two Elements.

The terminology used herein for the purpose of describing examples is not intended to be limiting for further examples. Whenever a singular form such as "a," "an" and "the" is used and using only a single element is neither explicitly or implicitly defined as being mandato-ry, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "has", "having", "contain", "containing", "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

In semiconductor devices, e.g. silicon carbide (SiC) devices, a space-charge region may penetrate into body regions of transistors so that drain-induced barrier lowering may occur at these transistors. The short-channel effect may significantly influence a threshold voltage of the transistors and may impair an electrical characteristic of the silicon carbide device.

Concepts for reducing the penetration of the space-charge region into the body region may be provided by the examples described below. By reducing the penetration of the space-charge region into the body region of transistors, drain-induced barrier lowering may be reduced and electrical characteristics of the silicon carbide device may be improved.

FIG. 1 shows a schematic cross section of a silicon carbide device 100 according to an ex-emplary embodiment. The silicon carbide device 100 may comprise a transistor cell. The transistor cell may comprise a front side doping region 110 having a first conductivity type. The front side doping region 110 may be a source region or a drain region of the transistor cell. The front side doping region 110 may be located within a silicon carbide substrate of the silicon carbide device 100, for example adjacent to a surface of the silicon carbide substrate. For example, an upper surface of the front side doping region 110 may form a part of the surface of the silicon carbide substrate.

The transistor cell may comprise a body region 120 having a second conductivity type. The second conductivity type may be the opposite conductivity type of the first conductivity type. The first conductivity type may be an n-type resulting in an n-doped region and the second conductivity type may be a p-type resulting in a p-doped region, or vice versa.

The transistor cell may comprise a drift region 130, e.g. having the first conductivity type. For example, the drift region 130 may be located adjacent to the body region 120 so that a pn-junction exists between the body region 120 and the drift region 130.

The body region 120 may be located between the front side doping region 110 and the drift region 130, e.g. in a vertical direction. Alternatively, the body region 120 may be located between the front side doping region 110 and the drift region 130 in a direction differing from a vertical direction by at most 8 degrees, for example at least 2 degrees and/or at most 6 degrees (e.g. by 4 degrees) (e.g. in case of a vertical transistor cell) The body region 120 may be located adjacent to the front side doping region 110 so that a pn-j unction exists between the body region 120 and the front side doping region 110.

For example, a vertical direction and a vertical dimension or thicknesses of layers may be measured orthogonal to a front side surface and/or a back side surface of the silicon carbide substrate.

For example, the transistor cell of the silicon carbide device 100 may be a vertical transistor cell and the front side doping region 110, the body region 120, and the drift region 130 may be arranged vertically (e.g., in a stacked manner or one above the other) within the silicon carbide substrate. FIG. 1 shows additionally a gate trench with a gate insulation layer 150 and a gate electrode 160 in the trench for a vertical transistor cell.

For example, the body region 120 may comprise several doping portions. The body region 120 may comprise a first portion 121, e.g. having a first average net doping concentration. The body region 120 may comprise a second portion 122, e.g. having a second average net doping concentration. The first portion 121 may be located between the drift region 130 and the second portion 122. For example, the first portion 121 may be located between the drift region 130 and the second portion 122 in the vertical direction.

The first portion 121 of the body region 120 may have an extension of at least 50 nm (or of at least 70 nm, of at least 100 nm, of at least 150 nm, or of at least 200 nm) within the body region 120, e.g. in the vertical direction or in the direction differing from a vertical direction by at most 8 degrees. In addition or as an alternative, the second portion 122 of the body region 120 may have an extension of at least 50 nm (or of at least 100 nm, of at least 200 nm, or of at least 300 nm) within the body region 120 in the vertical direction or in the direction differing from a vertical direction by at most 8 degrees. Here and in the following, an extension of a portion of a doped region, for example a portion of the body region, may be the full width at half maximum (FWHM) of said portion.

The vertical direction may extend from the front side doping region 110 to the drift region 130. The direction from the front side doping region 110 to the drift region 130 and/or the vertical direction may be a direction in parallel to an interface between the body region 120 and a gate insulation layer 150 of the transistor cell. For example, the first portion 121 of the body region may have an extension of at most 300 nm (or at most 200 nm, or at most 150 nm) in the vertical direction and/or in the direction parallel to the interface between the body region 120 and the gate insulation layer 150. For example, the direction of extension may be a vertical direction or may differ from a vertical direction by at least 2 degrees and/or at most 6 degrees (e.g. by 4 degrees), e.g. if the interface is tilted with respect to the vertical direction. The first portion 121 may have a mainly vertical extension of at least 50 nm, if the transistor cell is a vertical transistor cell.

For example, the second average net doping concentration may differ from the first average net doping concentration. For example, the first average net doping concentration may be at least two times (or at least three times, at least five times, or at least 10 times) the second average net doping concentration and/or at most 20 times (or at most 10 times) the second average net doping concentration. For example, the first average net doping concentration may be at least $1 \cdot 10^{17}$ cm$^{-3}$ (or at least $3 \cdot 10^{17}$ cm$^{-3}$, or at least $7 \cdot 10^{18}$ cm$^{-3}$) and/or at most $2 \cdot 10^{18}$ cm$^{-3}$ (or at most $8 \cdot 10^{17}$ cm$^{-3}$, or at most $5 \cdot 10^{18}$ cm$^{-3}$).

For example, the first portion 121 with a relatively small extension, e.g. vertical extension, may provide a fieldstop against penetration of a space-charge region from the drift region 130 into the body region 120 of the transistor cell during operation. Consequently, drain induced barrier lowering may be reduced within the transistor of the silicon carbide device 100, for example. A reduction of the threshold voltage of the transistor may be avoided or reduced. For example, a switching characteristic of the transistor or the transistor cell of the silicon carbide device 100 may be improved by providing the first portion 121.

For example, the transistor cell may comprise a gate insulation layer. At least the second portion 122 of the body region 120 may be located adjacent to and/or in contact with the gate insulation layer 150 of the transistor cell.

The first portion 121 of the body region 120 may be located adjacent (e.g., directly adjacent) to and/or in contact with the gate insulation layer 150 of the transistor cell. Alternatively, a spacer region (not depicted in the embodiment of FIG. 1) may be located between the first portion of the body region 120 and the gate insulation layer 150 of the transistor cell. The spacer region may separate the first portion 121 from the gate insulation layer 150. By providing the spacer region, a direct contact between the first portion 121 of the body region 120 and the gate insulation layer may be avoided. By keeping the first portion 121 of the body region 120 separated from the gate insulation layer, an influence of the first portion 121 on the threshold voltage of the transistor may be kept low.

For example, the spacer region may be a doped region having the first conductivity type. For example, the spacer region is a portion of a common doping region of the first conductivity type comprising the drift region as well. The spacer region may have a higher doping concentration than the drift region. That is to say, the spacer region may be a portion of a common doping region of the first conductivity type comprising the drift region as well, wherein the doping concentration is increased in said portion. For example, the spacer region may have a doping concentration similar or identical to a doping concentration of a current spread region of the silicon carbide device.

Alternatively, the spacer region may have the second conductivity type. In this case, an average net doping concentration of the spacer region may be lower than the first average net doping concentration. For example, the average net doping concentration of the spacer region may be at most 50% (or at most 40%, or at most 30%) the first average net doping concentration. For example, the average net doping concentration of the spacer region may differ from the second average net doping concentration by less than 10% of the second average net doping concentration.

For example, a distance (e.g. a minimal distance and/or a lateral distance) between the first portion 121 of the body region 120 and the gate insulation 150 layer may be at least 20 nm (or at least 50 nm, at least 100 nm, or at least 200 nm) and/or at most 500 nm (or at most 300 nm, or at most 200 nm). The distance between the first portion 121 and the gate insulation layer 150 may be caused by the spacer region between the first portion 121 and the gate insulation layer 150.

For example, at least 80% (or at least 90%) of the doping atoms within the first portion 121 of the body region 120 may be at least one of aluminum atoms or gallium atoms. In general, doping atoms may have an influence (e.g. an intended influence) onto an electrical characteristic of the transistor cell, for example. Doping atoms may be electrically active atoms, e.g. acting as donators and/or acceptors in an operating mode of the transistor cell. Diffusion of at least one of aluminum atoms or gallium atoms within the silicon carbide substrate may be negligible. Due to the absence of diffusion, a small height (or vertical extension) of the first portion 121 may be achieved, for example.

For example, at least 80% (or at least 90%) of the doping atoms within the second portion 122 of the body region 120 may be at least one of boron atoms, boron difluoride molecules, fluorine atoms or chlorine atoms. For example, by using boron atoms for the doping of the second portion 122, the channel mobility within the second portion 122 may be improved. For example, as boron atoms may diffuse within the silicon carbide substrate, the second portion 122 can be formed with a low number of implantations. Further, fluorine (e.g., from boron difluoride molecules or from fluorine atoms) may saturate so-called "dangling bonds" at the interface between the gate insulation layer and the silicon carbide substrate.

For example, the silicon carbide device 100 may further comprise a third portion of the body region 120 (not depicted in the embodiment of FIG. 1). The third portion of the body region may have a third average net doping concentration. The third portion may have an extension of at least 50 nm within the body region, e.g. in the vertical direction or in a direction differing from a vertical direction by at most 8 degrees. The third portion of the body region 120 may be located between the second portion 122 of the body region 120 and the front side doping region 110. The third portion may at least partially define the threshold voltage of the transistor cell of the silicon carbide device, for example. The threshold voltage may, however, also be defined by other portions or regions of the silicon carbide device, such as, e.g., the second portion.

For example, the third average net doping concentration may be higher than the first average net doping concentration. The third average net doping concentration may be at least two times (or at least three times, at least five times, or at least 10 times) the second average net doping concentration and/or at most 30 times (or at most 20 times or at most 10 times) the second average net doping concentration. Typically, the third average net doping concentration is at least 10 times and at most 20 times the second average net doping concentration. A higher third average net doping concentration in comparison to the second average net doping concentration may lead to an improved contact to the body region. Further, a high third average net doping concentration may support suppression of an accidental switch-on due to a parasitic npn transistor in the case of a short circuit (so-called anti-latch-up). Alternatively, the third average net doping concentration may be lower than the first average net doping concentration. For example, this may be the case in an embodiment of a silicon carbide device comprising a doping region.

Providing the third portion within the body region 120 may result in a well-shaped doping profile within the body region 120 from the first portion 121 to the third portion as the doping concentration of the intermediate second portion 122 may be lower than the doping concentration of the first portion 121 and the third portion.

For example, at least 80% (or at least 90%) of the doping atoms within the third portion of the body region may be at least one of boron atoms, boron difluoride molecules, fluorine atoms or chlorine atoms or at least 80% (or at least 90%) of the doping atoms within the third portion of the body region may be at least one of boron atoms or aluminum atoms. Boron atoms within the third portion may cause an improved stability of the threshold voltage of the transistor of the silicon carbide device 100.

If the first portion 121 of the body region 120 is located adjacent to the gate insulation layer of the transistor cell, a first maximum net doping concentration within the third portion of the body region may be implemented to be higher than a second maximum net doping concentration within the first portion of the body region, for example. With the second maximum net doping concentration of the first portion 121 lower than the first maximum net doping concentration of the third portion, the first portion 121 might not, or not significantly, influence the threshold voltage of the transistor.

For example, the silicon carbide device 100 may comprise a current spread region (not depicted in the embodiment of FIG. 1), e.g. having the first conductivity type. The current spread region may be located between the body region 120 and the drift region 130. An average net doping concentration of the current spread region may be at least two times an average net doping concentration of the drift region 130. For example, the current spread region may extend vertically over at least 200 nm (or at least 500 nm or at least 800 nm).

For example, the silicon carbide device 100 may further comprise a drain region of the transistor cell (not shown in the sections shown in the figures), e.g. having the first conductivity type, with an average net doping concentration of the drain region being at least 30 times or even at least 100 times the average net doping concentration of the drift region 130, for example. The drain region may be located at a back side of the silicon carbide substrate. The back side may be opposite the front side. Additionally, a buffer layer of the first conductivity type may be implemented between the drain layer and the drift zone. A thickness of the buffer layer may be at least 1 μm and at most 30 μm. A doping concentration of the buffer layer may be at least $1 \cdot 10^{17}$ cm$^{-3}$ and at most $8 \cdot 10^{18}$ cm$^{-3}$.

Figure 4:
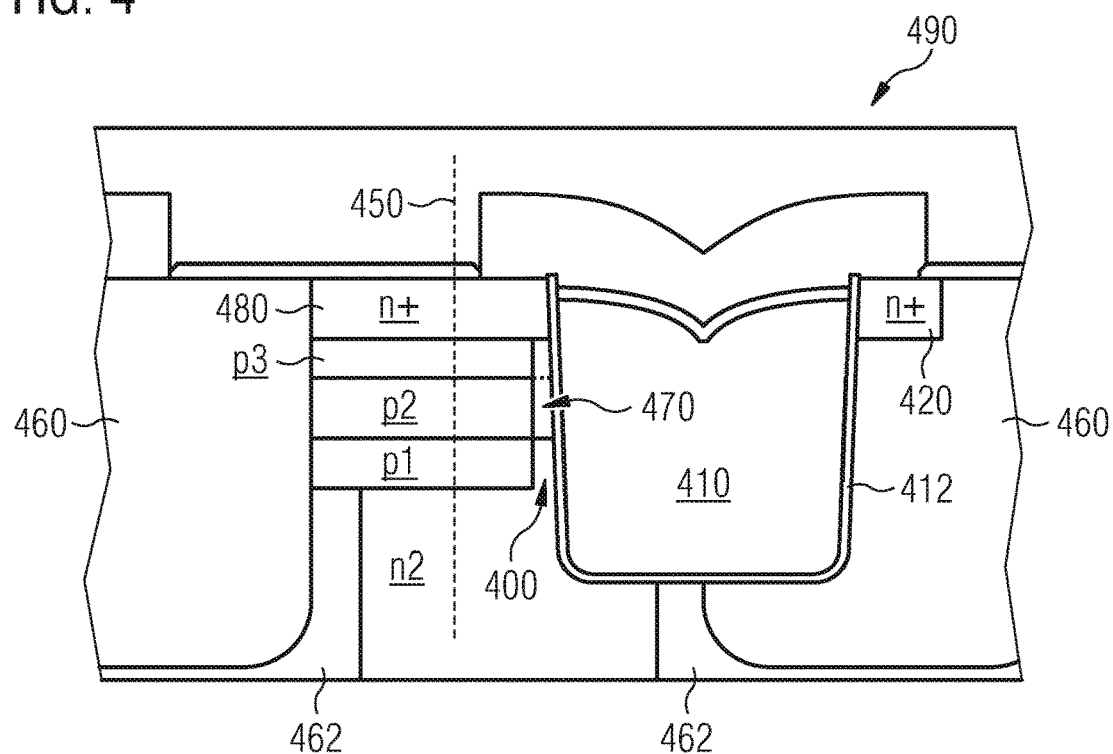
FIG. 4 shows a schematic cross section of an embodiment of a silicon carbide device with a spacer region.

For example, the transistor cell of the silicon carbide device may comprise a trench gate. The trench gate may comprise the gate electrode and the gate insulation layer located in a gate trench. For example, a transistor (e.g. transistor cell) may be arranged at only one side of the trench gate (e.g. as shown in FIG. 4). In this case, a first sidewall of the trench gate may adjoin the transistor cell. A second, opposite sidewall may be free of the transistor cell. Alternatively, the transistor cell of the silicon carbide device may be located on two sides of the trench gate so that a body region may be located at two opposite sides of the trench gate. For example, at least one portion of each body region may be contact with a respective sidewall of the trench gate, e.g. a gate insulation layer of the trench gate.

For example, in addition to a gate electrode, a second electrode may be located at a bottom of the gate trench. The second electrode may be used to contact a shielding doping region located adjacent to and/or below a bottom of the trench. The shielding doping region may have the second conductivity type. For example, the second electrode may be connected or connectable to a different voltage (e.g. source voltage) than the gate electrode (e.g. the source voltage).

The transistor cell of the silicon carbide device 100 may be a transistor cell of a plurality of transistor cells of a transistor arrangement. A transistor cell may comprise one or more source regions (e.g. distributed or located along a gate), at least one body region and a gate (e.g. a trench gate located within a gate trench extending into the semiconductor substrate), for example, Further, the transistor cells of the plurality of transistor cells may share a common (mutual) drift region and/or a common drain region (e.g. if the transistor cells are MOSFET cells) or a common collector region (e.g. if the transistor cells are IGBT cells).

The transistor of the silicon carbide device 100 and/or the transistor arrangement (e.g. insulated gate field effect transistor IGFET, metal-oxide-semiconductor field effect transistor MOSFET or insulated gate bipolar transistor IGBT) may be a vertical transistor structure conducting current between a front side surface of the silicon carbide substrate and a back side surface of the silicon carbide substrate. For example, the transistor arrangement of the silicon carbide device comprises a plurality of source doping regions connected to a source wiring structure, a plurality of gate electrodes or a gate electrode grid connected to a gate wiring structure and a back side drain metallization.

The silicon carbide device 100 may be a power semiconductor device. A power semiconductor device or an electrical structure (e.g. the transistor cell of the silicon carbide device 100) of the power semiconductor device may have a breakdown voltage or blocking voltage of more than 100 V or more than 500 V or more than 1 kV.

Figure 2:
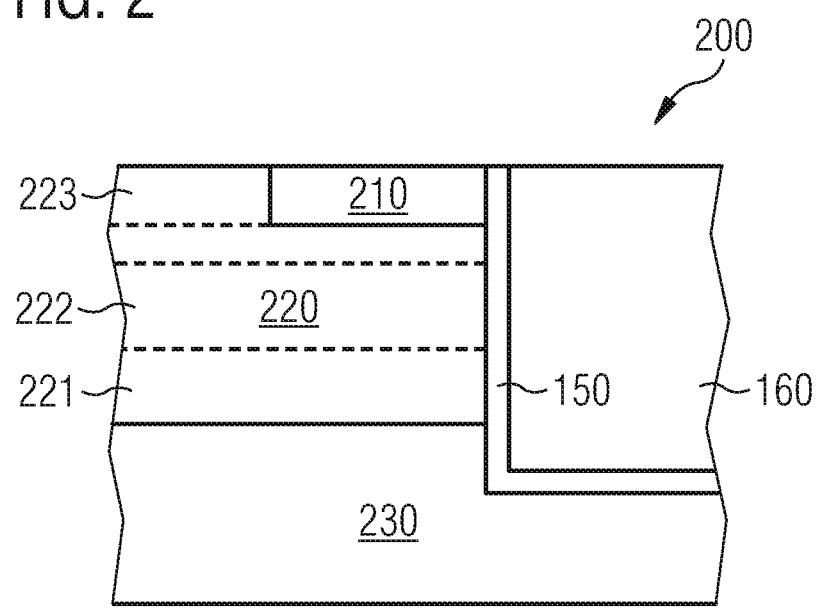
FIG. 2 shows a schematic cross section of an embodiment of a silicon carbide device with a body region comprising at least three portions.

FIG. 2 shows a schematic cross section of a silicon carbide device 200 according to an embodiment. The silicon carbide device 200 may comprise a transistor cell, e.g. comprising a front side doping region 210. The front side doping region 210 may have a first conductivity type. The transistor cell may comprise a body region 220 having a second conductivity type, and/or a drift region 230 having the first conductivity type. The body region 220 may be located between the front side doping region 210 and the drift region 230, e.g. in a vertical direction.

The body region 220 may comprise a first portion 221, e.g. having a first average net doping concentration. The body region 220 may comprise a second portion 222, e.g. having a second average net doping concentration, and/or a third portion 223, e.g. having a third average net doping concentration.

The first portion 221 may be located between the drift region 230 and the second portion 222. The second portion 222 may be located between the first portion 221 and the third portion 223. The first portion 221 and/or the second portion 222 and/or the third portion 223 may each have an extension of at least 50 nm in the vertical direction. The vertical direction may be a direction extending from the front side doping region to the drift region, for example.

The first average net doping concentration may be at least two times the second average net doping concentration. The third average net doping concentration may be at least two times the second average net doping concentration.

The third portion 223 may be located adjacent to the front side doping region 210, for example. In an example, the first portion 221, the second portion 222, and the third portion 223 may be arranged vertically within the body region 220, e.g. as vertical stack, e.g. in a vertical transistor of the silicon carbide device 200.

The first average net doping concentration may be at least two times the second average net doping concentration. The third average net doping concentration may be at least two times the second average net doping concentration.

More details and aspects are mentioned in connection with the embodiments described above or below. The embodiments shown in FIG. 2 may comprise one or more optional ad-ditional features corresponding to one or more aspects mentioned in connection with the proposed concept of one or more embodiments described above or below (e.g. FIG. 1 or 3-5).

Some embodiments relate to semiconductor devices with a transistor comprising a body region as described with respect to FIG. 1 or FIG. 2. In these examples, the body region may be provided in another wide band gap semiconductor substrate instead of silicon carbide. For example, a wide band gap semiconductor substrate may have a band gap larger than 2 eV, for example larger than 3 eV. For example, the wide band gap semiconductor substrate may be a diamond (C) substrate, a gallium nitride (GaN)-based semiconductor substrate.

Figure 3:
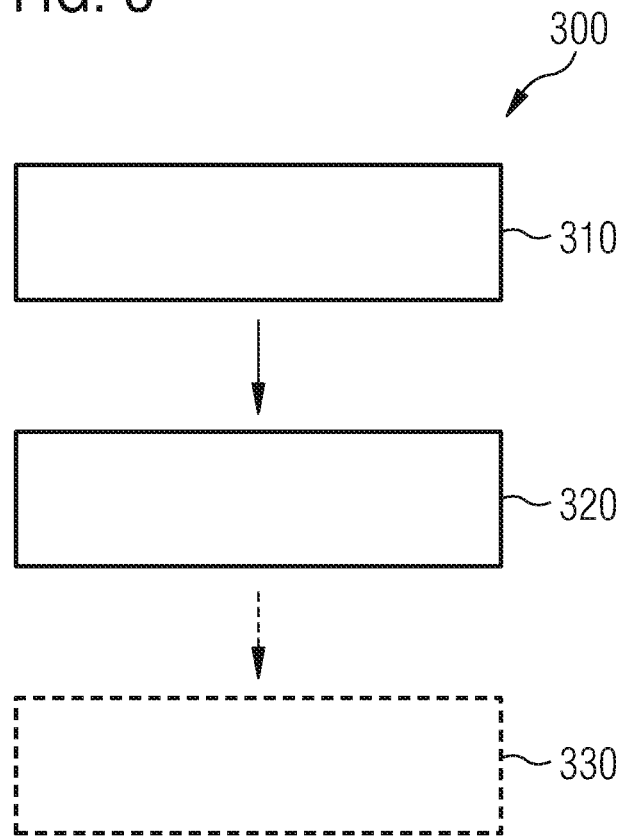
FIG. 3 shows a flow chart of a method for forming a silicon carbide device according to an embodiment.

FIG. 3 shows a flow chart of a method 300 for forming a silicon carbide device according to an embodiment. The method 300 may be used to form embodiments of a silicon carbide device as described herein.

The method 300 may comprise implanting 310 first dopants into a silicon carbide substrate with a first implantation dose to form a first portion of a body region of a transistor of the silicon carbide device. The first portion of the body region may have an extension of at least 50 nm within the body region in a vertical direction, e.g. a direction from a front side doping region of the transistor to a drift region of the transistor.

Further, the method 300 may comprise implanting 320 second dopants into the silicon carbide substrate with a second implantation dose to form a second portion of the body region. The second portion may be formed adjacent to the first portion. For example, the second portion of the body region may have an extension of at least 50 nm within the body region.

For example, the first implantation dose may be at least two times the second implantation dose. The first implantation dose may be at least $2 \cdot 10^{12}$ cm$^{-2}$. The implantation doses may be adapted according to an extension of the doping portions, e.g. the implantation doses may be selected so that a doping concentration of the first portion is at least two times a doping concentration of the second portion.

The method 300 may further comprise forming a front side doping region of the transistor adjacent to the body region. The front side doping region may have the first conductivity type. For example, the first portion of the body region may have an extension of at least 30 nm within the body region in a direction from the front side doping region to a drift region of the transistor.

For example, the first dopants are implanted with a first implantation energy higher than a second implantation energy used for implanting the second dopants.

Further, a third portion of the body region may be formed by implanting third dopants into the silicon carbide substrate with a third implantation energy lower than the second implantation energy. For example, for forming the second portion (and/or the first portion and/or the third portion), one or more implantation processes may be performed, e.g. with different implantation energies and/or different implantation doses.

According to an aspect, the method 300 may comprise forming 330 a mask for implanting the first dopants so that the first portion of the body region is formed at a distance from a gate insulation layer of the transistor. The forming 330 the mask may be performed before implanting the first dopants. For example, the first portion of the body region may be formed with a minimal distance to the gate insulation layer of at least 20 nm (or at least 50 nm) and/or at most 500 nm (or at most 300 nm).

More details and aspects are mentioned in connection with the embodiments described above or below. The embodiments shown in FIG. 3 may comprise one or more optional ad-ditional features corresponding to one or more aspects mentioned in connection with the proposed concept of one or more embodiments described above or below (e.g. FIG. 1-2 or 4-5).

FIG. 4 shows a schematic cross section of a silicon carbide device 490. Even though the silicon carbide device 490 of FIG. 4 is depicted as an n-channel transistor device, a p-channel transistor device can also be implemented, e.g. by changing the respective doping types from n to p and vice versa.

The silicon carbide device 490 may be implemented similar to the implementation described in connection with FIG. 1 and/or FIG. 2. The silicon carbide device 490 comprises a transistor comprising a body region located vertically between a front side doping region 480 (which can be a highly n-doped source region 480) and a lightly n-doped drift region and/or a current spread region n2. The body region comprises a first portion p1 (e.g. fieldstop), a second portion p2, and an optional third portion p3 implemented as described in connection with FIG. 1 and/or FIG. 2.

The silicon carbide device 490 comprises a trench gate with a gate trench. For example, a gate insulation layer 412 of the trench gate is located between the body region and a gate electrode 410 located in the gate trench. In an operating mode of the transistor, a current flow through a channel region 470 of the transistor may be controlled by a gate voltage applied to the gate electrode 410.

A spacer region 400 may be located laterally between the first portion p1 of the body region and the gate insulation layer 412.

A highly p-doped region 460 of the silicon carbide device may be located adjacent to the gate insulation layer 412 at a second side wall of the gate structure opposite to a first side wall of the trench gate located adjacent to the body region of the transistor. The highly p-doped region 460 extends from the bottom of the trench gate along the second side wall of the trench gate to a highly n-doped region 420 and/or to the front side surface. Further, a highly p-doped shielding region 462 may be located at the bottom of the gate trench. The highly p-doped shielding region 462 may be in contact with or part of the highly p-doped region 460.

The highly n-doped region 420 may extend along the second side wall of the trench gate from the highly p-doped region 460 to the front side surface of the silicon carbide substrate. The highly n-doped region 420 may be formed simultaneously with the front side doping region 480. For example, the highly n-doped region 420 may be electrically connected to the front side doping region 480.

More details and aspects are mentioned in connection with the embodiments described above or below. The embodiments shown in FIG. 4 may comprise one or more optional ad-ditional features corresponding to one or more aspects mentioned in connection with the proposed concept of one or more embodiments described above or below (e.g. FIG. 1-3 or 5).

Figure 5:
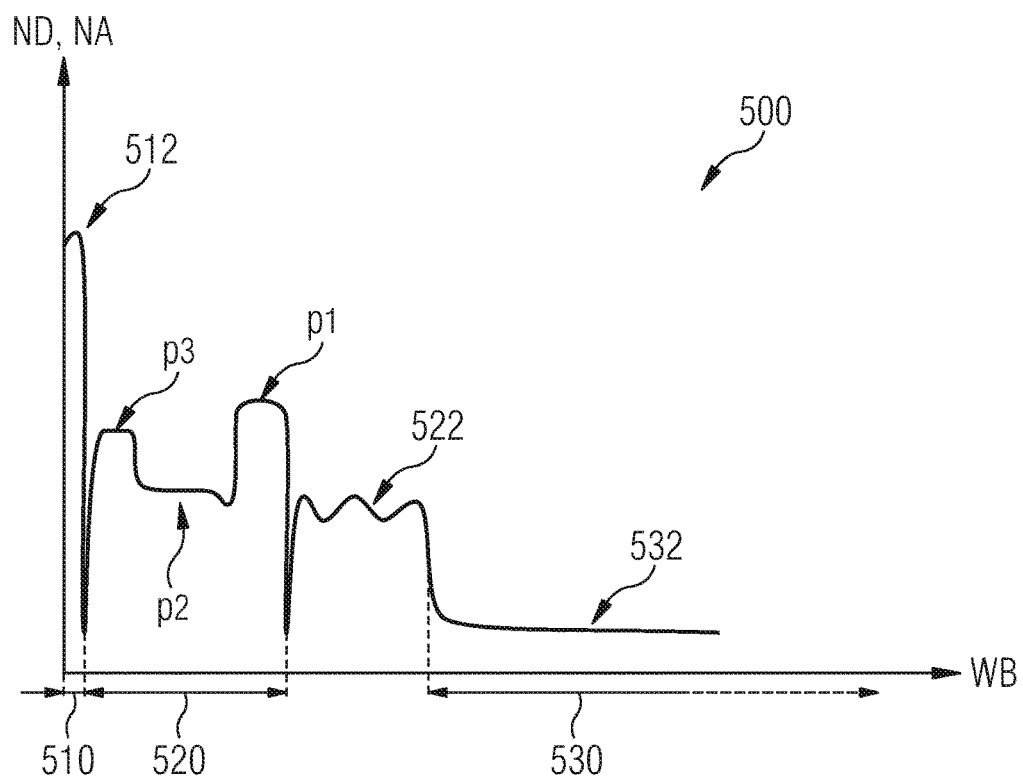
FIG. 5 shows a schematic doping profile of a silicon carbide device according to an embodiment.

FIG. 5 shows a schematic doping profile 500 of a silicon carbide device. The doping profile 500 shows the net doping concentrations of donors ND and acceptors NA over depth WB within different regions of a silicon carbide device (e.g. along a cross section 450 shown in FIG. 4). For example, the doping profile 500 is a vertical doping profile. For example, the doping profile shown in FIG. 5 may be optimized with respect to an n-channel silicon carbide (SiC) based device with a p-type body region.

The doping profile 500 shows the relative doping concentrations in the front side doping region 510 (e.g., an n-type source region or n+ source 512), the body region 520, a current spread region 522 (which may be n-doped) and a drift zone 532 (which may be n-doped) of a transistor. The body region 520 is p-doped. The body region 520 may comprise three components (e.g. seen in the order from the front side along the vertical direction): a third portion p3 (e.g. comprising boron atoms), a second portion p2 (e.g.

comprising boron atoms) and a first portion p1 (e.g. comprising aluminum atoms and providing a fieldstop).

The first portion p1 of the body region may have a very short vertical extension. The first portion p1 may have an effect similar to a field stop zone of the body region 520, e.g. against the dynamic penetration of the space charge region of the silicon carbide device into the body region 520. The first portion p1 may comprise at least one of aluminum atoms or gallium atoms as doping atoms.

The second portion p2 may have a medium vertical extension. The second portion p2 may basically define the channel resistance. The second portion p2 has a lower doping concentration than the first portion p1. The second portion may, for example, comprise boron as doping atoms.

The third portion p3 may have a relatively narrow vertical extension. The third portion p3 may, at least partially, define the threshold voltage. Further, if the second conductivity type is a p-type, the third portion p3 may reduce a resistive path for holes in the case of high-energy short circuit and/or avalanche, thus supporting suppression of turn-on of a parasitic npn transistor. For example, the third portion p3 has a higher doping concentration than the second portion p2 and may be formed by a boron implantation.

The first portion may be realized by implanting aluminum as doping atoms, which may act as acceptor atoms. Aluminum atoms may show a negligible diffusion. Therefore, it may be possible to realize a short vertical extension of the first portion. The vertical half width of the first portion (i.e. the FWHM of the first portion in the vertical direction) may be between at least 50 nm and at most 300 nm, for example between at least 70 nm and at most 200 nm. The implantation dose may be scaled so that the penetration of a space charge region is pre-vented effectively. For example, the implantation dose may be in a range between $1 \cdot 10^{12}$ and $5 \cdot 10^{13}$ atoms per $cm^2$, typically between $2 \cdot 10^{12}$ and $2 \cdot 10^{13}$ atoms per $cm^2$. Within silicon-based power semiconductors, such a narrow first portion (e.g., a narrow field stop region) might be more difficult to realize due to the diffusion in subsequent process acts, which might not be negligible.

In case the maximum doping concentration of the first portion of the body region is lower than or equal to the maximum doping concentration of the third portion of the body region, the first portion may extend up to the gate insulation layer without influencing the threshold voltage. If the maximum doping concentration of the first portion exceeds the maximum doping concentration of the third portion, however, a certain spacing (e.g. via the spacer region) between the first portion and the gate insulation layer may be provided to prevent an influence of the first portion on the threshold voltage. For example, a lateral width of the spacer region may be in a range between at least 20 nm and at most 500 nm, typically between at least 50 nm and at most 300 nm.

The second portion of the body region may be implemented by a boron doping. The boron doping may, to a certain extent, also extend into the drift region. A boron doping may result in several effects: (i) Less implantation acts may be required, as during subsequent high-temperature processes a diffusion of boron (which might not be negligible) may lead to vertical smearing of the implantation profile. (ii) Additionally, in a boron doped region, an improved channel mobility may be obtained. (iii) Further, the boron doping (e.g. parts of the boron doping atoms in the drift zone) may cause a recombination effect in case of a suitable dimensioning, which recombination effect may result in a reduction of the so-called bipolar drift. Optionally, the second portion may also contain at least one of aluminum atoms or gallium atoms as doping atoms.

The third portion of the body region may comprise aluminum atoms as doping atoms either alone or, in some examples, in combination with boron atoms and/or gallium atoms. As a mere example, in FIG. 5, boron is used as a dopant for the third portion, but a substantial part of the doping atoms in this zone may be aluminum atoms. The use of boron may bring a further effect regarding the stability of the threshold voltage: during processing of the silicon carbide substrate, hydrogen may be introduced into the semiconductor and acceptor-hydrogen complexes may form. This may lead to an instability of the threshold voltage if said complexes are dissolved due to current or temperature. As a consequence of the higher binding energy of boron-hydrogen complexes, as compared to aluminum-hydrogen complexes, an increased stability of the threshold voltage in operation may be achieved with boron as a doping atom.

Optionally, instead of boron as doping atoms, boron difluoride (BF2) molecules may be used, for example as doping atoms in the second portion. Fluorine may have the characteristic of being able to saturate "dangling bonds" at the interface between the gate insulation layer and the silicon carbide substrate in a stable and efficient way. Dangling bonds saturated by hydrogen may be less stable under stress, like e.g. increased temperature and/or high current densities.

Fluorine, for example boron difluoride, may also be utilized independently from the presence of the first portion in the body region. The silicon carbide device may thus be free of a first portion in the bode region. In this case, the second portion and/or the third portion may be present, wherein the second portion and/or the third portion comprise fluorine as doping atoms. Optionally, fluorine atoms or chlorine atoms may alternatively or additionally be exploited as ions not containing boron, preferably by implantation into the substrate surface.

More details and aspects are mentioned in connection with the embodiments described above or below. The embodiments shown in FIG. 5 may comprise one or more optional ad-ditional features corresponding to one or more aspects mentioned in connection with the proposed concept or of one or more embodiments described above or below (e.g. FIGS. 1-4).

Examples relate to concepts for reducing drain induced barrier lowering or short-channel effects in silicon carbide devices. It may be desired to minimize the penetration of the space charge region into the p-body of silicon carbide based devices during operation of these devices. This way, drain induced barrier lowering (DIBL) may be significantly reduced. An excessive drain induced barrier lowering may decrease the threshold voltage of the device too much in case of a high drain-source voltage. This may cause high short-circuit currents with a DC link voltage close to an application voltage, for example. Further, in some embodiments, a switch-off performance may be influenced undesired, as with highly inductive switching with high overvoltage drain induced barrier lowering may cut off the channel faster. The device may switch "more aggressively" and strong successive LC oscillations may occur. This may be critical, for example, for high-voltage silicon carbide devices which have to switch high currents in a high parallel switching degree.

A deep p shielding structure may be implemented more narrow (p-hole reduction), but this may cause a strong increase of the $R_{DS,on}$.

By reducing the penetration of the field to the channel area (e.g. the channel region) and the resulting weakening of the DIBL an improved (e.g. softer) switching performance on the customer size may be achieved, for example, when high current applications are used with highly inductive circuits (e.g. traction applications). For example, a normal 1-stage gate driver which may be used for IGBTs may be applicable by using proposed concepts. Further, a low short-circuit current may be achieved which may increase the short circuit ro-bustness.

Examples relate to the realization of a special doping profile (e.g. the doping profile shown in FIG. 5) for silicon carbide based devices, which may counteract, for example, the penetration of the space charge region into the p-body during operation of the device.

The proposed concepts may be detected by using doping profile analyses by means of spreading resistance measurements or secondary-ion mass spectrometry SIMS analyses. The proposed concepts may be applied to various power semiconductor devices, for example.

The aspects and features mentioned and described together with one or more of the previ-ously detailed examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for illustrative pur-poses to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respec-tively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A silicon carbide device comprising:
a transistor cell comprising: a front side doping region having a first conductivity type, a body region having a second conductivity type, and a drift region having the first conductivity type, the body region being located between the front side doping region and the drift region in a vertical direction,
wherein the body region comprises a first portion having a first average net doping concentration and a second portion having a second average net doping concentration, the first portion being located between the drift region and the second portion, and
wherein the body region comprises a third portion having a third average net doping concentration, wherein the third portion is located between the second portion and the front side doping region.

2. The silicon carbide device according to claim 1, wherein the transistor cell comprises a gate insulation layer, wherein at least the second portion is located adjacent to the gate insulation layer.

3. The silicon carbide device according to claim 1, wherein at least 80% of doping atoms within the first portion are at least one of aluminum atoms or gallium atoms.

4. The silicon carbide device according to claim 1, wherein at least 80% of doping atoms within the second portion are at least one of boron atoms, boron difluoride molecules, fluorine atoms or chlorine atoms.

5. The silicon carbide device according to claim 2, wherein the first average net doping concentration is at least two times the second average net doping concentration, and
wherein the third average net doping concentration is at least two times the second average net doping concentration.

6. The silicon carbide device according to claim 5, wherein at least 80% of doping atoms within the third portion of the body region are at least one of boron atoms, aluminum atoms or gallium atoms.

7. The silicon carbide device according to claim 5, wherein the first portion is located adjacent to the gate insulation layer, wherein a first maximum net doping concentration within the third portion is higher than a second maximum net doping concentration within the first portion.

8. The silicon carbide device according to claim 1, wherein the transistor cell comprises a gate insulation layer, wherein at least one of the first portion, the second portion or the third portion is located adjacent to the gate insulation layer.

9. A silicon carbide device comprising:
a transistor cell comprising: a front side doping region having a first conductivity type, a body region having a second conductivity type, and a drift region having the first conductivity type, the body region being located between the front side doping region and the drift region in a vertical direction,
wherein the body region comprises a first portion having a first average net doping concentration, a second portion having a second average net doping concentration, and a third portion having a third average net doping concentration,
the first portion being located between the drift region and the second portion, the second portion being located between the first portion and the third portion,
wherein the first portion has an extension of at least 50 nm in the vertical direction, wherein the second portion has an extension of at least 50 nm in the vertical direction, wherein the third portion has an extension of at least 50 nm in the vertical direction, and wherein the first average net doping concentration is at least two times the second average net doping concentration, wherein the third average net doping concentration is at least two times the second average net doping concentration.

10. The silicon carbide device according to claim 9, wherein the transistor cell comprises a gate insulation layer, wherein at least one of the first portion, the second portion or the third portion is located adjacent to the gate insulation layer.

11. The silicon carbide device according to claim 9, wherein at least 80% of doping atoms within the first portion are aluminum atoms or gallium atoms.

12. The silicon carbide device according to claim 9, wherein at least 80% of doping atoms within the second portion are at least one of boron atoms, boron difluoride molecules, fluorine atoms or chlorine atoms.

13. The silicon carbide device according to claim 9, wherein at least 80% of doping atoms within the third portion are at least one of boron atoms, aluminum atoms or gallium atoms.

14. The silicon carbide device according to claim 9, wherein a first maximum net doping concentration within the third portion is higher than a second maximum net doping concentration within the first portion.

15. The silicon carbide device according to claim 9, comprising:
a current spread region having the first conductivity type, wherein the current spread region is located between the body region and the drift region.

16. The silicon carbide device according to claim 9, wherein the front side doping region is a source region of the transistor cell.

17. The silicon carbide device according to claim 9, wherein the transistor cell is a vertical transistor cell.

18. A method for forming a silicon carbide device, comprising:
implanting first dopants into a silicon carbide substrate with a first implantation dose to form a first portion of a body region of a transistor of the silicon carbide device, wherein the first portion of the body region has an extension of at least 50 nm in a vertical direction;
implanting second dopants into the silicon carbide substrate with a second implantation dose to form a second portion of the body region,
wherein the first implantation dose is at least two times the second implantation dose, wherein the first implantation dose is at least $2 \cdot 10^{12}$ cm$^{-2}$; and
forming a third portion of the body region, wherein the third portion has a higher average net doping concentration than the second portion.

19. The method according to claim 18, wherein the forming the third portion comprises implanting third dopants into the silicon carbide substrate with a third implantation energy,
wherein the first dopants are implanted with a first implantation energy higher than a second implantation energy used for implanting the second dopants, and
wherein the third implantation energy is lower than the second implantation energy.

20. The method according to claim 18, wherein a transistor cell comprises the body region, wherein the transistor cell comprises a gate insulation layer, wherein at least one of the first portion, the second portion or the third portion is located adjacent to the gate insulation layer.

21. A silicon carbide device comprising:
a transistor cell comprising: a front side doping region having a first conductivity type, a body region having a second conductivity type, and a drift region having the first conductivity type, the body region being located between the front side doping region and the drift region in a vertical direction,
wherein the body region comprises a first portion having a first average net doping concentration and a second portion having a second average net doping concentration, the first portion being located between the drift region and the second portion, and
wherein the body region comprises a third portion having a third average net doping concentration.

22. The silicon carbide device according to claim 21, at least some doping atoms within the first portion are gallium atoms.

23. The silicon carbide device according to claim 21, wherein at least some doping atoms within the second portion are at least one of fluorine atoms or chlorine atoms.

* * * * *